(12) United States Patent
Lim

(10) Patent No.: US 11,881,244 B2
(45) Date of Patent: Jan. 23, 2024

(54) SEMICONDUCTOR MEMORY APPARATUS INCLUDING ADDRESS GENERATION CIRCUIT, ROW HAMMER DETECTION CIRCUIT AND OPERATION DETERMINATION CIRCUIT OPERATING TO ENSURE A STABLE REFRESH OPERATION AGAINST ROW HAMMERING

(71) Applicant: SK hynix Inc., Icheon-si (KR)

(72) Inventor: Jung Ho Lim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 57 days.

(21) Appl. No.: 17/536,607

(22) Filed: Nov. 29, 2021

(65) Prior Publication Data

US 2023/0031020 A1 Feb. 2, 2023

(30) Foreign Application Priority Data

Jul. 27, 2021 (KR) .................. 10-2021-0098693

(51) Int. Cl.
*G11C 11/406* (2006.01)
(52) U.S. Cl.
CPC .................. *G11C 11/406* (2013.01)

(58) Field of Classification Search
CPC ............... G11C 11/406; G11C 11/408; G11C 11/40611; G11C 11/40615
USPC ......................................... 365/222
See application file for complete search history.

(56) References Cited

U.S. PATENT DOCUMENTS

| | | | |
|---|---|---|---|
| 9,691,466 B1 * | 6/2017 | Kim | G11C 11/406 |
| 10,930,335 B2 * | 2/2021 | Bell | G11C 11/406 |
| 11,568,914 B2 * | 1/2023 | Hong | G11C 11/40603 |

FOREIGN PATENT DOCUMENTS

| | | |
|---|---|---|
| KR | 1020090017104 A | 2/2009 |
| KR | 1020160035444 A | 3/2016 |

* cited by examiner

*Primary Examiner* — Connie C Yoha
(74) *Attorney, Agent, or Firm* — William Park & Associates Ltd.

(57) ABSTRACT

A semiconductor memory apparatus includes an address generation circuit and an operation determination circuit. The address generation circuit generates a refresh target address that corresponds to a word line, among a plurality of word lines, the word line being adjacent to another word line in which row hammering has occurred. The operation determination circuit configured to generate an address matching information by comparing a row hammering address with the refresh target address.

15 Claims, 4 Drawing Sheets

SEMICONDUCTOR MEMORY APPARATUS INCLUDING ADDRESS GENERATION CIRCUIT, ROW HAMMER DETECTION CIRCUIT AND OPERATION DETERMINATION CIRCUIT OPERATING TO ENSURE A STABLE REFRESH OPERATION AGAINST ROW HAMMERING

CROSS-REFERENCES TO RELATED APPLICATION

The present application claims priority under 35 U.S.C. § 119(a) to Korean application number 10-2021-0098693, filed on Jul. 27, 2021, in the Korean Intellectual Property Office, which is incorporated herein by reference in its entirety.

BACKGROUND

1. Technical Field

Various embodiments generally relate to a semiconductor memory apparatus, an operating method thereof, a semiconductor memory system, and more particularly, to a semiconductor memory apparatus capable of performing a refresh operation on an adjacent word line when row hammering occurs, an operating method thereof, a semiconductor memory system.

2. Related Art

In general, a semiconductor memory apparatus includes a large number of memory cells in order to store data. Recently, as circuit design and process technologies are gradually developed, the number of memory cells that are included in a semiconductor memory apparatus increases exponentially and a circuit area that is occupied by one memory cell tends to be gradually reduced. In other words, the number of memory cells that are included in a predetermined area is gradually increasing.

A memory cell is connected to a word line and a bit line. A semiconductor memory apparatus performs a write operation and a read operation by activating the word line and transmitting/receiving data through the bit line. The write operation means that data that is received in the semiconductor memory apparatus from an exterior is stored in a memory cell, and the read operation means that the data that is stored in the memory cell is transmitted to an external device. Accordingly, the semiconductor memory apparatus preferentially performs an active operation that activates the word line that is connected to the memory cell, in order to perform the write operation and the read operation.

Meanwhile, as the number of memory cells gradually increases, the interval between word lines that are connected to each of a plurality of memory cells gradually decreases. As described above, the word line substantially maintains an activated state through the active operation. Subsequently, the word line substantially maintains an inactivated state after the write operation and the read operation. Accordingly, when the write operation and the read operation are continuously performed on a specific word line, an activated state and an inactivated state of the corresponding word line are inevitably repeated. In other words, the corresponding word line repeatedly toggles between the activated state and the inactivated state.

Subsequently, the corresponding word line repeatedly toggles, which causes a coupling phenomenon in a word line that is adjacent to the corresponding word line due to the toggling of the corresponding word line. In such a case, the word line that is adjacent to the word line that toggles needs to substantially maintain an inactivated state, but does not substantially maintain a stable inactivated state due to the coupling phenomenon. Therefore, data that is stored in a memory cell that is connected to the adjacent word line does not substantially maintain a normal state due to the word line with an instable inactivated state. In other words, when the write operation and the read operation are continuously performed on a specific word line, a memory cell that is connected to the adjacent word line has a problem in that stored data is lost.

Hereinafter, for convenience of description, a phenomenon that results from the active operation, such as a write operation, a read operation, and the like, being concentrated on a specific word line will be defined as row hamming. When the row hamming occurs, a semiconductor memory apparatus performs a refresh operation on an adjacent word line in order to overcome problems due to the row hamming.

Meanwhile, when the refresh operation on the adjacent word line is not properly performed, data that corresponds to the adjacent word line may be lost. Therefore, when the row hamming occurs, it is necessary to check whether the refresh operation on the adjacent word line is properly performed. Hereinafter, for convenience of description, an adjacent word line to be subjected to the refresh operation will be referred to as a "refresh target word line".

SUMMARY

A semiconductor memory apparatus according to an embodiment of the present disclosure may include: an address generation circuit configured to generate a refresh target address that corresponds to a word line, among a plurality of word lines, the word line being adjacent to another word line in which row hammering has occurred; and an operation determination circuit configured to generate an address matching information by comparing the refresh target address with a row hammering address that corresponds to the word line in which the row hammering has occurred.

An operating method of a semiconductor memory apparatus according to an embodiment of the present disclosure may include: detecting row hammering on a plurality of word lines; detecting a row hammering address that corresponds to a word line, among the plurality of word lines, in which the row hammering has occurred; generating a refresh target address that corresponds to a word line that is adjacent to the word line in which the row hammering has occurred; performing an arithmetic operation on the refresh target address and performing an arithmetic operation on the row hammering address; and determining whether the refresh target address has been normally generated by comparing results of the step of performing the arithmetic operations.

A semiconductor memory system according to an embodiment of the present disclosure may include: a semiconductor memory apparatus configured to detect row hammering on a plurality of word lines to generate a row hammering detection signal and configured to generate an address matching information by comparing a row hammering address that corresponds to a word line in which the row hammering has occurred with a refresh target address that corresponds to a word line that is adjacent to the word line in which the row hammering has occurred; and a system control apparatus configured to provide the refresh target address to the semiconductor memory apparatus based on the row hammering detection signal and the address matching information.

DETAILED DESCRIPTION

The description of the present disclosure is an embodiment for a structural and/or functional description. The scope of rights of the present disclosure should not be construed as being limited to embodiments described in the specification. That is, the scope of rights of the present disclosure should be understood as including equivalents, which may realize the technical spirit, because an embodiment may be modified in various ways and may have various forms. Furthermore, objects or effects proposed in the present disclosure do not mean that a specific embodiment should include all objects or effects or include only such effects. Accordingly, the scope of rights of the present disclosure should not be understood as being limited thereby.

The meaning of the terms that are described in this application should be understood as follows.

The terms, such as the "first" and the "second," are used to distinguish one element from another element, and the scope of the present disclosure should not be limited by the terms. For example, a first element may be named a second element. Likewise, the second element may be named the first element.

An expression of the singular number should be understood as including plural expressions, unless clearly expressed otherwise in the context. The terms, such as "include" or "have," should be understood as indicating the existence of a set characteristic, number, step, operation, element, part, or a combination thereof, not excluding a possibility of the existence or addition of one or more other characteristics, numbers, steps, operations, elements, parts, or a combination thereof.

In each of the steps, symbols (e.g., a, b, and c) are used for convenience of description, and the symbols do not describe an order of the steps. The steps may be performed in an order different from the order described in the context unless a specific order is clearly described in the context. That is, the steps may be performed according to a described order, may be performed substantially at the same time as the described order, or may be performed in reverse order of the described order.

All the terms used herein, including technological or scientific terms, have the same meanings as those that are typically understood by those skilled in the art, unless otherwise defined. Terms defined in commonly used dictionaries should be construed as with the same meanings as those in the context in related technology and should not be construed as with ideal or excessively formal meanings, unless clearly defined in the application.

Various embodiments may be provided a semiconductor memory apparatus capable of detecting a refresh target word line when row hammering occurs, an operating method thereof, a semiconductor memory system.

An embodiment of the present disclosure has an effect of ensuring a stable refresh operation against row hammering by stably detecting a refresh target word line.

Figure 1:
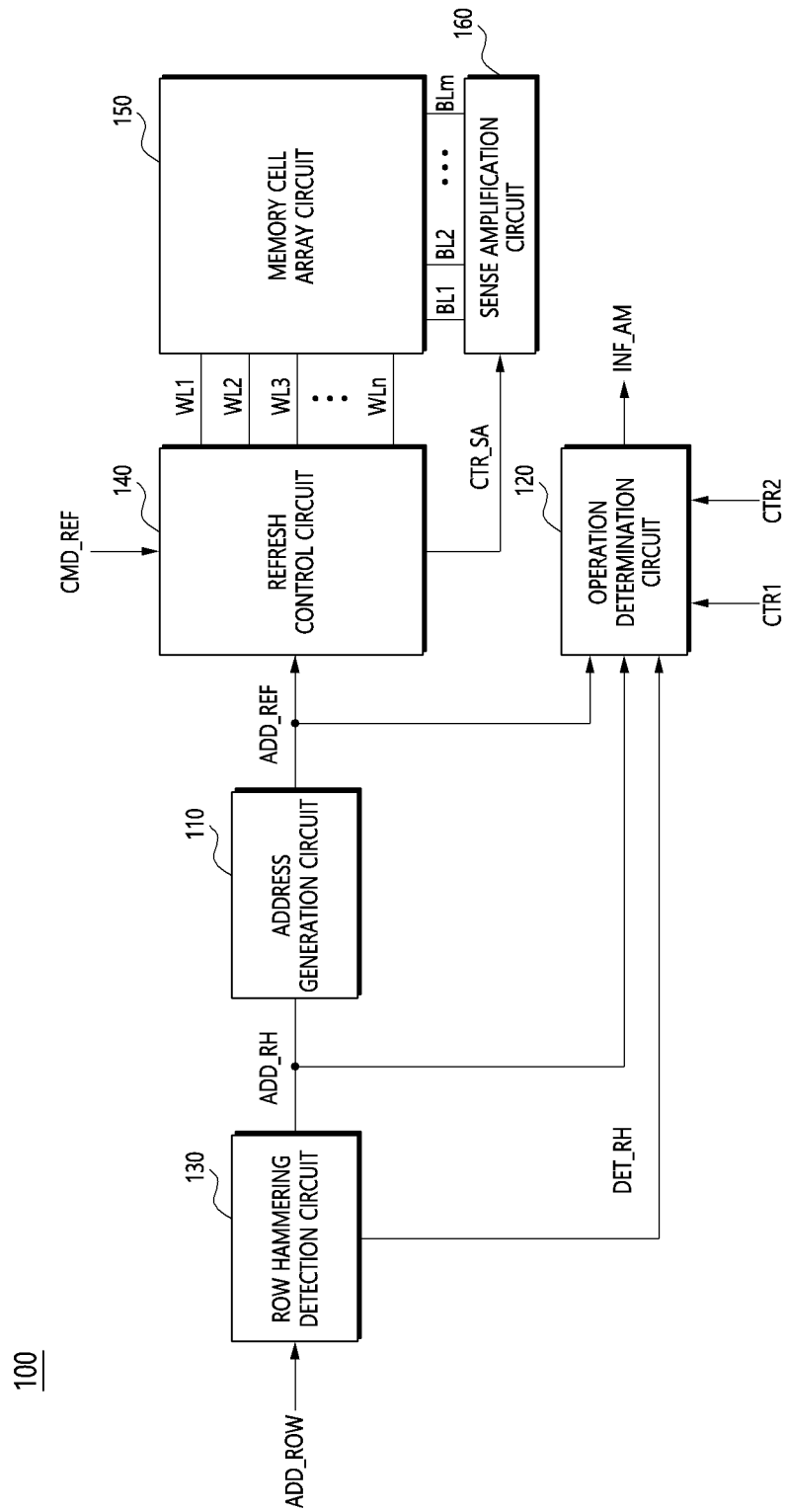
FIG. 1 is a block diagram illustrating a configuration of a semiconductor memory apparatus in accordance with an embodiment of the present disclosure.

FIG. 1 is a block diagram illustrating a configuration of a semiconductor memory apparatus 100 in accordance with an embodiment of the present disclosure.

Referring to FIG. 1, the semiconductor memory apparatus 100 may include an address generation circuit 110 and an operation determination circuit 120.

First, the address generation circuit 110 may be configured to generate a refresh target address ADD_REF that corresponds to a word line, among a plurality of word lines WL1, WL2, ... WLn (n is a natural number), adjacent to a word line in which row hammering has occurred. The address generation circuit 110 may receive a row hammering address ADD_RH and generate the refresh target address ADD_REF.

The row hammering address ADD_RH may be provided by a row hammering detection circuit 130, which will be described below. The row hammering address ADD_RH may be address information that is detected when a row address ADD_ROW is input a preset number of times. For reference, the row address ADD_ROW may include address information that corresponds to each of the plurality of word lines WL1, WL2, ... WLn. Furthermore, the refresh target address ADD_REF may include address information that corresponds to a refresh target word line that is the word line that is adjacent to the word line in which row hammering has occurred.

Furthermore, the address generation circuit 110 may include an addition/subtraction circuit (not illustrated). The addition/subtraction circuit may generate the refresh target address ADD_REF by performing operations that correspond to −1 and +1 on the row hammering address ADD_RH. When the operations that correspond to −1 and +1 are performed on the row hammering address ADD_RH, the refresh target address ADD_REF may include address information that corresponds to a word line that is adjacent to a word line that corresponds to the row hammering address ADD_RH.

For example, when it is assumed that the row hammering address ADD_RH is an address that corresponds to a second word line WL2, the refresh target address ADD_REF may include addresses that correspond to first and third word lines WL1 and WL3, which are word lines that are adjacent to the second word line WL2. For example, when it is assumed that the row hammering address ADD_RH is an address that corresponds to the first word line WL1, the refresh target address ADD_REF may include an address that corresponds to the second word line WL2 that is adjacent to the first word line WL1.

Next, the operation determination circuit 120 may be configured to generate address matching information INF_AM by comparing the refresh target address ADD_REF with the row hammering address ADD_RH that corresponds to the word line in which row hammering has occurred. The operation determination circuit 120 may perform a latching operation on the row hammering address ADD_RH and the refresh target address ADD_REF based on a row hammering detection signal DET_RH and first and second control signals CTR1 and CTR2, which will be described below.

The address matching information INF_AM may include the result of determining whether the refresh target address ADD_REF, corresponding to the row hammering address ADD_RH, has been correctly generated. The operation determination circuit 120 will be described in more detail with reference to FIG. 2.

The semiconductor memory apparatus 100 may include the address generation circuit 110 and the operation determination circuit 120. Through such a configuration, the semiconductor memory apparatus 100 may determine whether the refresh target address ADD_REF has been correctly generated by comparing the row hammering address ADD_RH and the refresh target address ADD_REF.

Furthermore, the semiconductor memory apparatus 100 may include the row hammering detection circuit 130, a refresh control circuit 140, a memory cell array circuit 150, and a sense amplification circuit 160.

First, the row hammering detection circuit 130 may be configured to generate the row hammering address ADD_RH and the row hammering detection signal DET_RH when the row address ADD_ROW is input with substantially the same address value a preset number of times. As described above, the row address ADD_ROW may be address information that corresponds to each of the plurality of word lines WL1, WL2, . . . WLn.

The row hammering detection circuit 130 may include a counting circuit (not illustrated) and a comparison circuit (not illustrated) therein. The row hammering detection circuit 130 may count the row address ADD_ROW that is input with substantially the same address value and may compare the counting value that is generated as the result of counting a preset number of times. The row hammering detection circuit 130 may output the row address ADD_ROW as the row hammering address ADD_RH through the counting operation and the comparison operation and may output the row hammering detection signal DET_RH together therewith. Accordingly, the row hammering address ADD_RH may include information that corresponds to the row address ADD_ROW that is input a preset number of times. The row hammering detection signal DET_RH may include information that indicates that row hammering has occurred.

Next, the refresh control circuit 140 may be configured to control a refresh operation on a word line that is adjacent to a word line, among the plurality of word lines WL1, WL2, . . . WLn, in which row hammering has occurred. The refresh control circuit 140 may receive a refresh command signal CMD_REF and the refresh target address ADD_REF and may perform an active operation on a word line, among the plurality of word lines WL1, WL2, . . . WLn, corresponding to the refresh target address ADD_REF. Then, the refresh control circuit 140 may generate a sense amplification control signal CTR_SA that activates the sense amplification circuit 160, which will be described below.

Next, the memory cell array circuit 150 may be configured to include a plurality of memory cells (not illustrated). The plurality of memory cells may be connected to the plurality of word lines WL1, WL2, . . . WLn and a plurality of bit lines BL1, BL2, . . . BLm (m is a natural number).

Next, the sense amplification circuit 160 may be configured to sense and amplify data that is transferred through the plurality of bit lines BL1, BL2, . . . BLm, based on the sense amplification control signal CTR_SA.

In other words, the refresh control circuit 140 may activate the word line that corresponds to the refresh target address ADD_REF through the active operation. At this time, the refresh control circuit 140 may generate the sense amplification control signal CTR_SA. Then, the sense amplification circuit 160 may sense and amplify data that is transferred through the plurality of bit lines BL1, BL2, . . . BLm, based on the sense amplification control signal CTR_SA. Accordingly, after row hammering occurs, the word line that is adjacent to the word line in which row hammering has occurred, that is, the word line that corresponds to the refresh target address ADD_REF may be activated based on the refresh command signal CMD_REF. Then, data that is stored in a memory cell that is connected to the activated word line may be amplified by the sense amplification circuit 160 and stored again.

The fact that the data that is stored in the memory cell is stored again may correspond to the fact that the refresh operation on the memory cell is performed. As a consequence, when row hammering occurs, the semiconductor memory apparatus 100 may perform the refresh operation on a plurality of memory cells that are connected to the word line that is adjacent to the word line in which row hammering has occurred.

Figure 2:
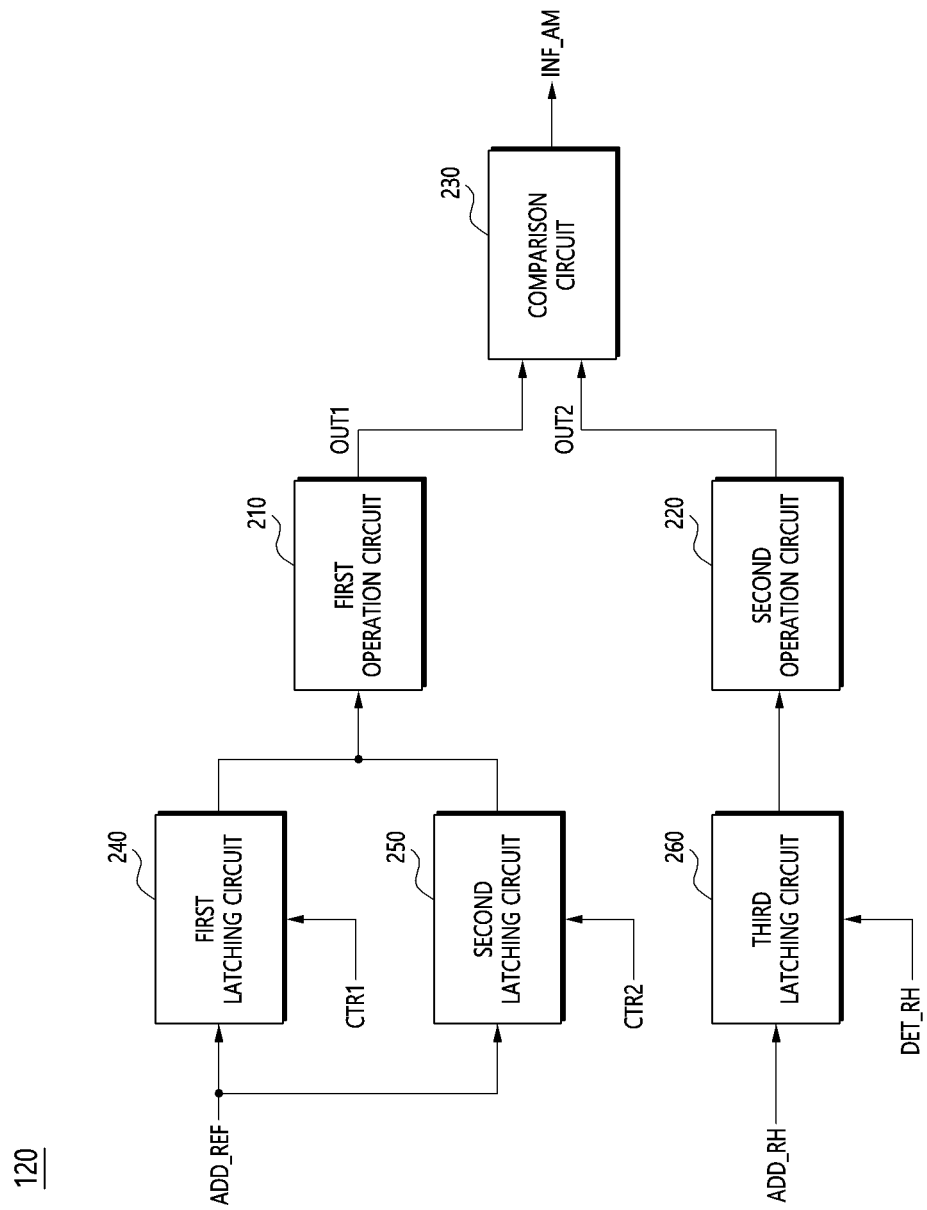
FIG. 2 is a block diagram illustrating a configuration of an operation determination circuit of FIG. 1.

FIG. 2 is a block diagram illustrating a configuration of the operation determination circuit 120 of FIG. 1.

Referring to FIG. 2, the operation determination circuit 120 may include a first operation circuit 210, a second operation circuit 220, and a comparison circuit 230.

First, the first operation circuit 210 may be configured to perform arithmetic operations on the refresh target address ADD_REF. As described above, the refresh target address ADD_REF may include an address that is obtained by performing the operation that corresponds to −1 on the row hammering address ADD_RH and an address that is obtained by performing the operation that corresponds to +1 on the row hammering address ADD_RH. Hereinafter, for convenience of description, a refresh target address ADD_REF that is obtained by performing the operation that corresponds to −1 on the row hammering address ADD_RH will be referred to as a "first refresh target address", and a refresh target address ADD_REF that is obtained by performing the operation that corresponds to +1 on the row hammering address ADD_RH, will be referred to as a "second refresh target address". Therefore, the first operation circuit 210 may perform an addition operation, among the arithmetic operations, on the first refresh target address and the second refresh target address, and output the result of the addition operation.

Next, the second operation circuit 220 may be configured to perform arithmetic operations on the row hammering address ADD_RH. The second operation circuit 220 may perform an addition operation, among the arithmetic operations, on the row hammering address ADD_RH and the second operation circuit 220 and may output the result of the addition operation.

Next, the comparison circuit 230 may be configured to generate the address matching information INF_AM by comparing output values OUT1 and OUT2 of the first operation circuit 210 and the second operation circuit 220. The comparison circuit 230 may compare a first output value OUT1 of the first operation circuit 210 with a second output value OUT2 of the second operation circuit 220. For example, when the output values OUT1 and OUT2 are substantially equal to each other, the comparison circuit 230 may generate the address matching information INF_AM at a logic 'low' level. For example, when the output values OUT1 and OUT2 are not substantially equal to each other, the comparison circuit 230 may generate the address matching information INF_AM at a logic 'high' level.

Hereinafter, a simple circuit operation of the operation determination circuit 120 will be described. For convenience of description, it is assumed that the row hammering address ADD_RH is '0101'. Accordingly, the refresh target address ADD_REF may be '0100', which is obtained by performing the operation that corresponds to −1 on the row hammering address ADD_RH, and '0110', which is obtained by performing the operation that corresponds to +1 on the row hammering address ADD_RH. Here, '0100' may correspond to the first refresh target address, and '0110' may correspond to the second refresh target address.

The first operation circuit 210 may perform an addition operation on '0100' that corresponds to the first refresh target address and '0110' that corresponds to the second refresh target address. As a consequence, the first operation circuit 210 may output '1010' as the first output value OUT1. Subsequently, the second operation circuit 220 may perform an addition operation on '0101' that corresponds to the row hammering address ADD_RH and the second operation circuit 220. As a consequence, the second operation circuit 220 may output '1010'. Since the first output value OUT1 '1010' and the second output value OUT2 '1010' are substantially the same value, the comparison circuit 230 may generate the address matching information INF_AM at a logic 'low' level. When the address matching information INF_AM is at a logic 'low' level, it may mean that the refresh target address ADD_REF, corresponding to the row hammering address ADD_RH, has been correctly generated.

When the refresh target address ADD_REF is not '0100', which is obtained by performing the operation that corresponds to −1 on the row hammering address ADD_RH, or is not '0110', which is obtained by performing the operation that corresponds to +1 on the row hammering address ADD_RH, the first output value OUT1 may have a value that is different from the second output value OUT2. At this time, the comparison circuit 230 may generate the address matching information INF_AM at a logic 'high' level. When the address matching information INF_AM is at a logic 'high' level, it may mean that the refresh target address ADD_REF, corresponding to the row hammering address ADD_RH, has been incorrectly generated.

The semiconductor memory apparatus 100 may generate the address matching information INF_AM by comparing the refresh target address ADD_REF to the row hammering address ADD_RH. The address matching information INF_AM that is detected by the semiconductor memory apparatus 100 may be a criterion for determining whether the refresh operation has been correctly performed when row hammering occurs.

Meanwhile, the operation determination circuit 120 may include a first latching circuit 240, a second latching circuit 250, and a third latching circuit 260.

The first latching circuit 240 may be configured to latch the refresh target address ADD_REF based on a first control signal CTR1. The first control signal CTR1 may be a signal that is activated based on the refresh command signal CMD_REF of FIG. 1.

Next, the second latching circuit 250 may be configured to latch the refresh target address ADD_REF based on a second control signal CTR2. The second control signal CTR2 may be a signal that is activated based on the refresh command signal CMD_REF.

As described above, the first control signal CTR1 and the second control signal CTR2 may be signals that are activated based on the refresh command signal CMD_REF. At this time, the refresh command signal CMD_REF may be a signal for controlling the refresh operation and may be activated during the refresh operation on one word line. Accordingly, the refresh command signal CMD_REF may be sequentially activated twice during the refresh operation due to the row hammering. In other words, the refresh command signal CMD_REF may be activated once during the refresh operation on the refresh target address ADD_REF, obtained by performing the operation that corresponds to −1 on the row hammering address ADD_RH, and then may be activated once again during the refresh operation on the refresh target address ADD_REF that is obtained by performing the operation that corresponds to +1 on the row hammering address ADD_RH.

In brief, the refresh command signal CMD_REF may be sequentially activated twice when row hammering occurs. Accordingly, the first control signal CTR1 may be activated based on the refresh command signal CMD_REF that is activated first, and the second control signal CTR2 may be activated based on the refresh command signal CMD_REF that is activated second. In other words, the first control signal CTR1 and the second control signal CTR2 may be sequentially activated based on the refresh command signal CMD_REF.

Next, the third latching circuit 260 may be configured to latch the row hammering address ADD_RH based on the row hammering detection signal DET_RH of FIG. 1. The third latching circuit 260 may latch the row hammering address ADD_RH based on the row hammering detection signal DET_RH that is detected when row hammering occurs.

The first refresh target address that is latched by the first latching circuit 240 may be provided to the first operation circuit 210, the second refresh target address that is latched by the second latching circuit 250 may be provided to the first operation circuit 210, and the row hammering address ADD_RH that is latched by the third latching circuit 260 may be provided to the second operation circuit 220. As described above, the comparison circuit 230 may generate the address matching information INF_AM.

Although not illustrated in the drawing, the address matching information INF_AM may be provided to the address generation circuit 110 of FIG. 1. The address generation circuit 110 may generate the refresh target address ADD_REF again based on the address matching information INF_AM. Then, the refresh control circuit 140 may perform the refresh operation based on the refresh target address ADD_REF that is generated again.

When the refresh target address ADD_REF, corresponding to the row hammering address ADD_RH, has been incorrectly generated, the semiconductor memory apparatus 100 may generate a correct refresh target address ADD_REF again by operating the address generation circuit 110 again based on the address matching information INF_AM. Consequently, the semiconductor memory apparatus 100 may ensure the refresh operation on a word line, which is adjacent to a word line in which row hammering has occurred, through the correct refresh target address ADD_REF that corresponds to the row hammering address ADD_RH.

Figure 3:
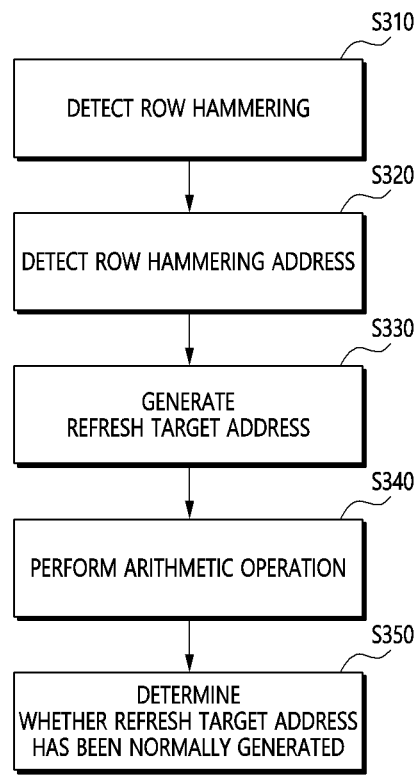
FIG. 3 is a flowchart illustrating an operating method of the semiconductor memory apparatus of FIG. 1.

FIG. 3 is a flowchart illustrating an operating method of the semiconductor memory apparatus 100 of FIG. 1.

Referring to FIG. 1 to FIG. 3, the operating method of the semiconductor memory apparatus 100 may include a step S310 of detecting row hammering, a step S320 of detecting a row hammering address, a step S330 of generating a refresh target address, a step S340 of performing an arithmetic operation, and a step S350 of determining whether the refresh target address has been normally generated.

First, the step S310 of detecting row hammering may be a step of detecting the row hammering on the plurality of word lines WL1, WL2, . . . WLn of FIG. 1. The step S310 of detecting row hammering may be performed by the row hammering of the detection circuit 130 of FIG. 1. The row hammering detection circuit 130 may detect row hammering and generate the row hammering detection signal DET_RH.

Next, the step S320 of detecting a row hammering address may be a step of detecting the row hammering address ADD_RH that corresponds to a word line, among the plurality of word lines WL1, WL2, . . . WLn, in which row hammering has occurred. The step S320 of detecting a row hammering address may be performed by the row hammering detection circuit 130. The row hammering detection circuit 130 may generate the row hammering address ADD_RH when row hammering occurs.

Next, the step S330 of generating a refresh target address may be a step of detecting the refresh target address ADD_REF that corresponds to a word line that is adjacent to the word line in which row hammering has occurred. The step S330 of generating a refresh target address may be performed by the address generation circuit 110. The address generation circuit 110 may generate the refresh target address ADD_REF by performing operations that correspond to −1 and +1 on the row hammering address ADD_RH.

Next, the step S340 of performing arithmetic operations may be a step of performing an arithmetic operation on the refresh target address ADD_REF and an arithmetic operation on the row hammering address ADD_RH. The step S340 of performing arithmetic operations may be performed by the first and second operation circuits 210 and 220 of the operation determination circuit 120 of FIG. 2. The first operation circuit 210 may perform an addition operation on the first refresh target address and the second refresh target address may and output the result of the addition operation. The second operation circuit 220 may perform an addition operation on the row hammering address ADD_RH and the second operation circuit 220 may and output the result of the addition operation.

Next, the step S350 of determining whether the refresh target address has been normally generated may be a step of determining whether the refresh target address ADD_REF has been normally generated by comparing the results of the step S340 of performing arithmetic operations. The step S350 of determining whether the refresh target address has been normally generated may be performed by the comparison circuit 230 of FIG. 2. The comparison circuit 230 may generate the address matching information INF_AM by comparing the output values OUT1 and OUT2 of the first operation circuit 210 and the second operation circuit 220. As described above, the address matching information INF_AM may include whether the refresh target address ADD_REF, corresponding to the row hammering address ADD_RH, has been correctly generated.

The semiconductor memory apparatus 100 may determine whether the refresh target address ADD_REF has been normally generated by comparing the result of the addition operation on the refresh target address ADD_REF with the result of the addition operation on the row hammering address ADD_RH.

Although not illustrated in the drawing, the semiconductor memory apparatus 100 may further include a step of re-performing the step S330 of generating a refresh target address based on the address matching information INF_AM that is generated in the step S350 of determining whether the refresh target address has been normally generated. The step of re-performing the step S330 may be performed by the address generation circuit 110. When the refresh target address ADD_REF has been incorrectly generated, the address generation circuit 110 may re-perform the step S330 of generating a refresh target address based on the address matching information INF_AM. In other words, the address generation circuit 110 may generate the refresh target address ADD_REF again based on the address matching information INF_AM.

Figure 4:
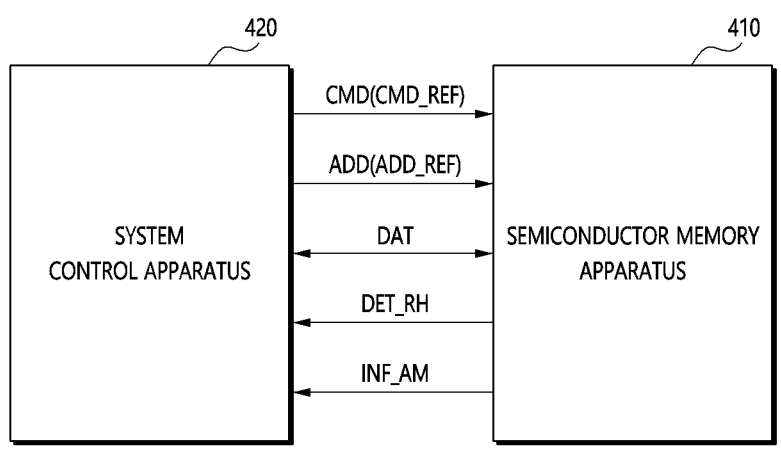
FIG. 4 is a block diagram illustrating a configuration of a semiconductor memory system in accordance with an embodiment of the present disclosure.

FIG. 4 is a block diagram illustrating a configuration of a semiconductor memory system 400 in accordance with an embodiment of the present disclosure.

Referring to FIG. 4, the semiconductor memory system 400 may include a semiconductor memory apparatus 410 and a system control apparatus 420.

First, the semiconductor memory apparatus 410 may correspond to the semiconductor memory apparatus 100 of FIG. 1. As described above with reference to FIG. 1, the semiconductor memory apparatus 410 may be configured to detect row hammering on the plurality of word lines WL1, WL2, . . . WLn and generate the row hammering detection signal DET_RH. Then, the semiconductor memory apparatus 410 may be configured to generate the address matching information INF_AM by comparing the row hammering address ADD_RH that corresponds to a word line in which row hammering has occurred with the refresh target address ADD_REF that corresponds to a word line that is adjacent to the word line in which row hammering has occurred.

For reference, the semiconductor memory apparatus 100 of FIG. 1 may generate the refresh target address ADD_REF again based on the address matching information INF_AM. In other words, when the refresh target address ADD_REF has been incorrectly generated, the semiconductor memory apparatus 100 may generate the refresh target address ADD_REF inside of the semiconductor memory apparatus 100. In the semiconductor memory system 400 of FIG. 4, when the refresh target address ADD_REF has been incorrectly generated, the system control apparatus 420 may generate the refresh target address ADD_REF, instead of the semiconductor memory apparatus 410. In other words, in the semiconductor memory system 400, the refresh target address ADD_REF may be generated outside of the semiconductor memory apparatus 410, that is, may be generated by the system control apparatus 420.

Next, the system control apparatus 420 may be configured to provide the refresh target address ADD_REF to the semiconductor memory apparatus 410 based on the row hammering detection signal DET_RH and the address matching information INF_AM. The system control apparatus 420 may provide a command signal CMD and an address signal ADD to the semiconductor memory apparatus 410. Based on the command signal CMD, the semiconductor memory apparatus 410 may perform a write operation and a read operation on a memory cell that corresponds to the address signal ADD. During the write operation, the system control apparatus 420 may transmit a data signal DAT to the semiconductor memory apparatus 410 based on the command signal CMD. Furthermore, during the read operation, the system control apparatus 420 may receive the data signal DAT from the semiconductor memory apparatus 410 based on the command signal CMD. In other words, the command signal CMD may be a control signal that corresponds to the write operation and the read operation.

Then, the system control apparatus 420 may provide the refresh target address ADD_REF to the semiconductor memory apparatus 410 through the address signal ADD based on the row hammering detection signal DET_RH and the address matching information INF_AM. At this time, the system control apparatus 420 may provide the semiconductor memory apparatus 410 with the refresh command signal CMD_REF for a refresh operation of the semiconductor memory apparatus 410 through the command signal CMD. This will be described in more detail with reference to FIG. 5 and FIG. 6.

Figure 5:
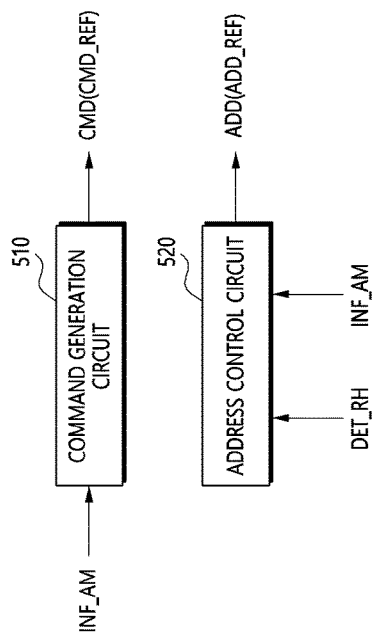
FIG. 5 is a block diagram illustrating a configuration of a system control apparatus of FIG. 4.

FIG. 5 is a block diagram illustrating a configuration of the system control apparatus 420 of FIG. 4.

Referring to FIG. 5, the system control apparatus 420 may include a command generation circuit 510 and an address control circuit 520.

First, the command generation circuit 510 may be configured to generate the command signal CMD that corresponds to the refresh command signal CMD_REF based on the address matching information INF_AM. The command generation circuit 510 may generate the command signal CMD that is capable of controlling a write operation, a read operation, and the like on the semiconductor memory apparatus 410 of FIG. 4. Furthermore, the command generation circuit 510 may generate the refresh command signal CMD_REF that is capable of controlling a refresh operation on the semiconductor memory apparatus 410. In other words, the command generation circuit 510 may generate the refresh command signal CMD_REF based on the address matching information INF_AM and may provide the refresh command signal CMD_REF to the semiconductor memory apparatus 410 through the command signal CMD.

Next, the address control circuit 520 may be configured to generate the address signal ADD that corresponds to the refresh target address ADD_REF based on the row hammering detection signal DET_RH and the address matching information INF_AM. The address control circuit 520 may generate the address signal ADD. The address signal ADD may include a row address ADD_ROW and a column address that is required for the write operation, the read operation, and the like on the semiconductor memory apparatus 410 of FIG. 4. For reference, the column address may be address information that corresponds to each of the plurality of bit lines BL1, BL2, . . . BLm.

Then, when the refresh target address ADD_REF has been incorrectly generated by the semiconductor memory apparatus 410, the address control circuit 520 may generate the refresh target address ADD_REF. In other words, the address control circuit 520 may generate the refresh target address ADD_REF based on the row hammering detection signal DET_RH and the address matching information INF_AM and may provide the refresh target address ADD_REF to the semiconductor memory apparatus 410 through the address signal ADD.

Figure 6:
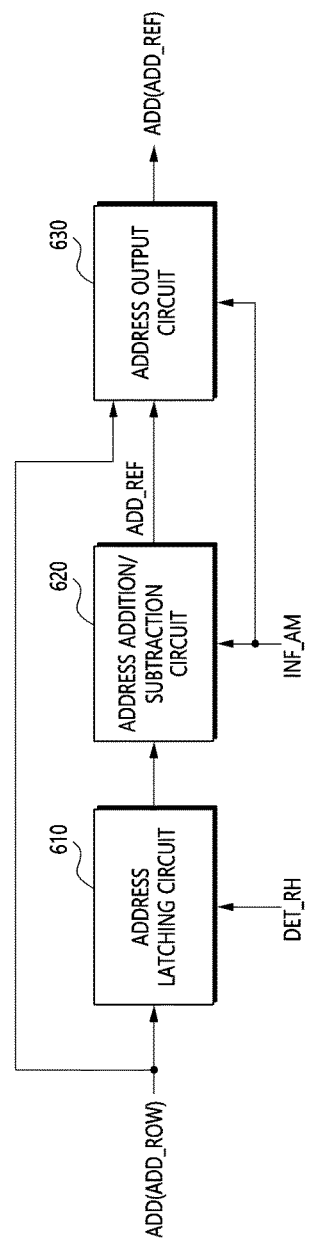
FIG. 6 is a block diagram illustrating a configuration of an address control circuit of FIG. 5.

FIG. 6 is a block diagram illustrating a configuration of the address control circuit 520 of FIG. 5.

Referring to FIG. 6, the address control circuit 520 may include an address latching circuit 610, an address addition/subtraction circuit 620, and an address output circuit 630.

First, the address latching circuit 610 may be configured to latch the row address ADD_ROW based on the row hammering detection signal DET_RH. The address latching circuit 610 may receive the address signal ADD. As described above, the address signal ADD may include the row address ADD_ROW. Accordingly, the address latching circuit 610 may latch the row address ADD_ROW based on the row hammering detection signal DET_RH. The row hammering detection signal DET_RH may be a signal that is activated when row hammering occurs. Therefore, the row address ADD_ROW that is latched by the address latching circuit 610 based on the row hammering detection signal DET_RH may correspond to the row hammering address ADD_RH.

Next, based on the address matching information INF_AM, the address addition/subtraction circuit 620 may be configured to perform an addition/subtraction operation on an address that is latched by the address latching circuit 610. As described above, the address that is latched by the address latching circuit 610 may correspond to the row hammering address ADD_RH. Accordingly, the address addition/subtraction circuit 620 may generate the refresh target address ADD_REF by performing an addition/subtraction operation on the row hammering address ADD_RH.

Next, based on the address matching information INF_AM, the address output circuit 630 may be configured to selectively output the row address ADD_ROW and the refresh target address ADD_REF, which is an output address of the address addition/subtraction circuit 620. The address matching information INF_AM may include the result of determining whether the refresh target address ADD_REF has been correctly generated by the semiconductor memory apparatus 410 based on the row hammering address ADD_RH. Accordingly, when the refresh target address ADD_REF has been incorrectly generated by the semiconductor memory apparatus 410, the address output circuit 630 may output the refresh target address ADD_REF.

The refresh target address ADD_REF that is output in this way may be provided to the semiconductor memory apparatus 410 of FIG. 4. The refresh target address ADD_REF that is output by the system control apparatus 420 may be generated based on the address matching information INF_AM. Therefore, the semiconductor memory apparatus 410 may substantially receive the refresh target address ADD_REF that is generated again after a refresh operation due to row hammering.

When the refresh target address ADD_REF has been incorrectly generated after row hammering occurs in the semiconductor memory apparatus 410, the semiconductor memory system 400 may provide a correct refresh target address ADD_REF to the semiconductor memory apparatus 410. Furthermore, the semiconductor memory system 400 may easily control a refresh operation on the semiconductor memory apparatus 410 based on the refresh command signal CMD_REF together with the refresh target address ADD_REF provided to the semiconductor memory apparatus 410.

What is claimed is:

1. A semiconductor memory apparatus comprising:
   an address generation circuit configured to generate a first refresh target address and a second refresh target address by performing operations on a row hammering address; and
   an operation determination circuit configured to generate an address matching information by comparing the row hammering address with a result of an operation on the first refresh target address and the second refresh target address.

2. The semiconductor memory apparatus according to claim 1, further comprising:
   a row hammering detection circuit configured to generate the row hammering address and a row hammering detection signal when a row address is input with substantially the same address value a preset number of times.

3. The semiconductor memory apparatus according to claim 1, wherein the operation determination circuit comprises:
a first operation circuit configured to perform a first addition operation on the first refresh target address and the second refresh target address;
a second operation circuit configured to perform a second addition operation on the row hammering address and the row hammering address; and
a comparison circuit configured to generate the address matching information by comparing output values of the first operation circuit and the second operation circuit.

4. The semiconductor memory apparatus according to claim 1, wherein the address generation circuit is configured to generate the first refresh target address by performing an operation that corresponds to −1 on the row hammering address, and generate the second refresh target address by performing an operation that corresponds to +1 on the row hammering address.

5. The semiconductor memory apparatus according to claim 2, wherein the operation determination circuit further comprises:
a first latching circuit configured to latch the first refresh target address based on a first control signal;
a second latching circuit configured to latch the second refresh target address based on a second control signal; and
a third latching circuit configured to latch the row hammering address based on the row hammering detection signal.

6. The semiconductor memory apparatus according to claim 5, wherein the first and second control signals are sequentially activated based on a refresh command signal.

7. The semiconductor memory apparatus according to claim 1, wherein the address generation circuit is configured to generate the first refresh target address and the second refresh target address again based on the address matching information.

8. An operating method of a semiconductor memory apparatus, the operating method comprising:
detecting row hammering on a plurality of word lines;
detecting a row hammering address that corresponds to a word line, among the plurality of word lines, in which the row hammering has occurred;
generating a first refresh target address and a second refresh target address corresponding to word lines adjacent to the word line in which the row hammering has occurred by performing operations on the row hammering address;
performing a first addition operation on the first refresh target address and the second refresh target address and a second addition operation on the row hammering address and the row hammering address; and
determining whether the refresh target address has been correctly generated by comparing results of the first addition operation with the second addition operation.

9. The operating method according to claim 8, further comprising:
re-performing the generation of the first refresh target address and the second refresh target address based on an address matching information that is generated in the step of determining.

10. The operating method according to claim 9, wherein a refresh operation is performed after the generation of the first refresh target address and the second refresh target address and the refresh operation is performed after the re-performing of the generation of the first refresh target address and the second refresh target address.

11. A semiconductor memory system comprising:
a semiconductor memory apparatus configured to detect row hammering on a plurality of word lines to generate a row hammering detection signal and a row hammering address according to an address signal, generate a first refresh target address and a second refresh target address by performing operations on the row hammering address, performs a first addition operation on the first refresh target address and the second refresh target address and a second addition operation on the row hammering address and the row hammering address and configured to generate an address matching information by comparing results of the first addition operation with the second addition operation; and
a system control apparatus configured to provide the address signal to the semiconductor memory apparatus based on the row hammering detection signal and the address matching information.

12. The semiconductor memory system according to claim 11, wherein the semiconductor memory apparatus further comprises:
a row hammering detection circuit configured to generate the row hammering address and the row hammering detection signal when a row address is input with substantially the same address value a preset number of times;
a first operation circuit configured to perform the first addition operation on the first refresh target address and the second refresh target address;
a second operation circuit configured to perform the second addition operation on the row hammering address and the row hammering address; and
a comparison circuit configured to generate the address matching information by comparing output values of the first operation circuit and the second operation circuit.

13. The semiconductor memory system according to claim 11, wherein the semiconductor memory apparatus is configured to generate the first refresh target address by performing an operation that corresponds to −1 on the row hammering address, and generate the second refresh target address by performing an operation that corresponds to +1 on the row hammering address.

14. The semiconductor memory system according to claim 11, wherein the system control apparatus comprises:
a command generation circuit configured to generate a command signal that corresponds to a refresh command signal based on the address matching information; and
an address control circuit configured to generate the address signal based on the row hammering detection signal and the address matching information.

15. The semiconductor memory system according to claim 14, wherein the address control circuit comprises:
an address latching circuit configured to latch a row address based on the row hammering detection signal;
an address addition/subtraction circuit configured to perform an addition/subtraction operation on an address that is latched by the address latching circuit, based on the address matching information; and
an address output circuit configured to selectively output the row address and an output address of the address addition/subtraction circuit based on the address matching information.

* * * * *